(12) United States Patent
Okamoto

(10) Patent No.: US 6,382,308 B2
(45) Date of Patent: May 7, 2002

(54) BOILING COOLING SYSTEM THAT EXCHANGES HEAT BETWEEN HIGHER-TEMPERATURE FLUID AND LOWER-TEMPERATURE FLUID

(75) Inventor: Yoshiyuki Okamoto, Nagoya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/851,307

(22) Filed: May 8, 2001

(30) Foreign Application Priority Data

May 19, 2000 (JP) ........................................ 2000-147640

(51) Int. Cl.$^7$ ............................................. F28D 15/00
(52) U.S. Cl. ........................... 165/104.21; 165/104.33; 361/700; 257/715
(58) Field of Search ............................... 165/80.2, 80.3, 165/104.33, 104.34, 185; 361/700; 257/715

(56) References Cited

U.S. PATENT DOCUMENTS

| | | | | |
|---|---|---|---|---|
| 5,592,830 A | * | 1/1997 | Baba et al. .................... | 62/509 |
| 5,806,583 A | * | 9/1998 | Suzuki et al. ........... | 165/104.33 |
| 5,823,248 A | * | 10/1998 | Kadota et al. ............... | 257/715 |
| 6,005,772 A | * | 12/1999 | Terao et al. ................. | 361/700 |
| 6,119,767 A | * | 9/2000 | Kadota et al. .......... | 165/104.33 |
| 6,131,647 A | * | 10/2000 | Suzuki et al. ........... | 165/104.33 |

* cited by examiner

*Primary Examiner*—Henry Bennett
*Assistant Examiner*—Terrell McKinnon
(74) *Attorney, Agent, or Firm*—Harness, Dickey & Pierce, PLC

(57) ABSTRACT

There is provided a boiling cooling system that exchanges heat between a higher-temperature fluid and a lower-temperature fluid through boiling heat transfer of a refrigerant sealingly contained within the boiling cooling system. The boiling cooling system includes a heat absorbing unit, a heat radiating unit, a vapor transfer pipe and a liquid return pipe. The refrigerant in the liquid state generally fills up to a top of an interior space of an upper tank of the heat absorbing unit and also generally fills up to a top of an interior space of a lower tank of the heat radiating unit while the boiling cooling system is not operated.

5 Claims, 5 Drawing Sheets

FIG. 3
FIG. 4
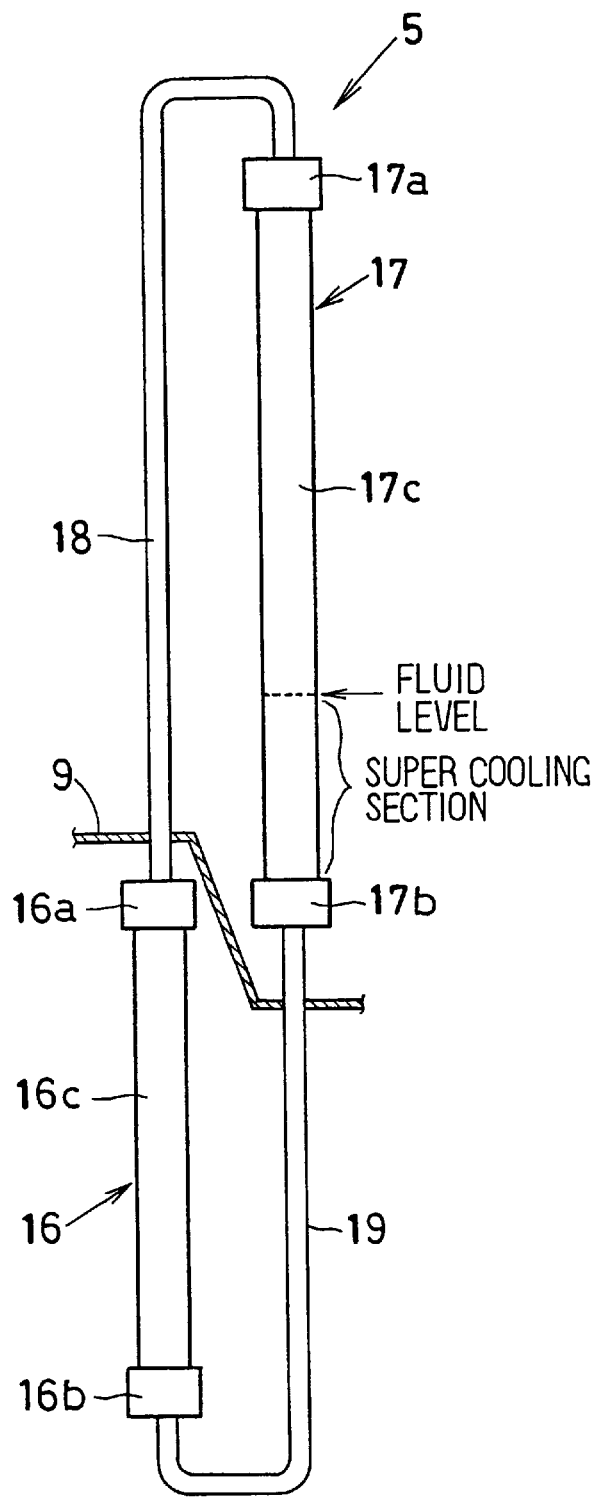
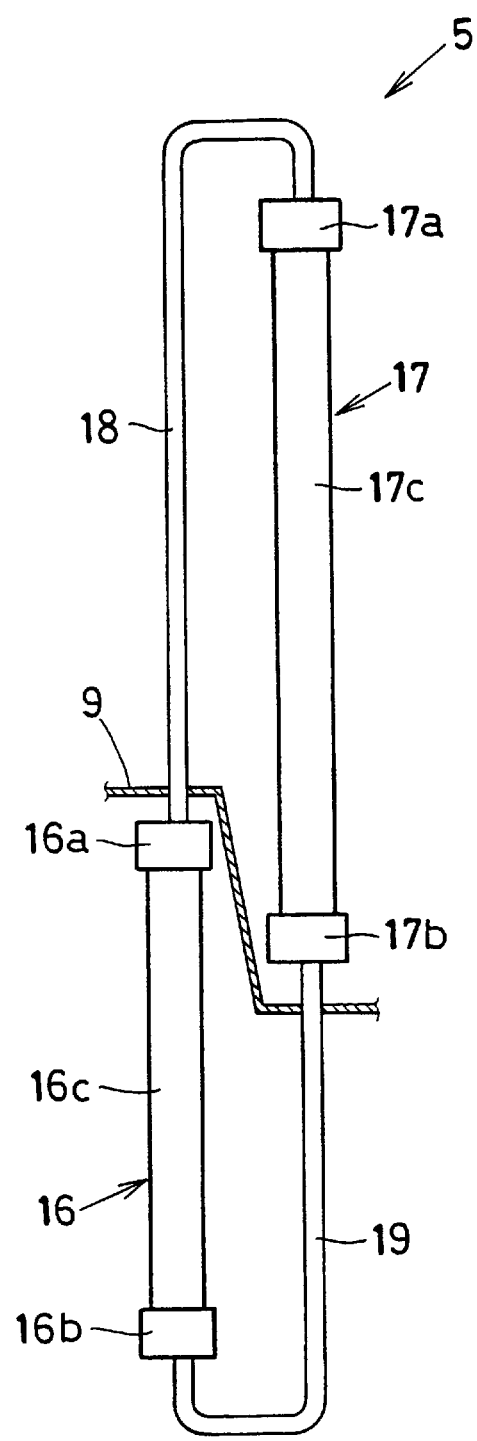

BOILING COOLING SYSTEM THAT EXCHANGES HEAT BETWEEN HIGHER-TEMPERATURE FLUID AND LOWER-TEMPERATURE FLUID

CROSS REFERENCE TO RELATED APPLICATION

This application is based on and incorporates herein by reference Japanese Patent Application No. 2000-147640 filed on May 19, 2000.

BACKGROUND OF THE INVENTION

1. Field of the Invention

The present invention relates to a boiling cooling system that exchanges heat between a higher-temperature fluid and a lower-temperature fluid through boiling heat transfer of a refrigerant that is sealingly contained within the boiling cooling system.

2. Description of Related Art

For instance, when it is required to cool an interior of a substantially airtight housing, such as a housing of a base station of a cellular phone system, the interior of the housing cannot be cooled by directly introducing external air into the interior of the housing. In such a case, a boiling cooling system may be used to exchange heat between internal air located within the housing and the external air located outside of the housing to cool the interior of the housing.

As shown in FIG. 6, one previously proposed type of boiling cooling system includes a first heat exchanging unit 110 located inside of a housing 100 and a second heat exchanging unit 120 located outside of the housing 100. The first heat exchanging unit 110 is communicated with the second heat exchanging unit 120 through pipes 130 to circulate a refrigerant, which is sealingly contained in the boiling cooling system, between the first heat exchanging unit 110 and the second heat exchanging unit 120. In the boiling cooling system, the liquid state refrigerant contained in the first heat exchanging unit 110 takes heat from higher-temperature air (hot air) contained within the housing 100 and vaporizes. Then, the transformed vapor state refrigerant in the first heat exchanging unit 110 flows into the second heat exchanging unit 120 through one of the pipes 130. In the second heat exchanging unit 120, the vapor state refrigerant radiates heat into external air or lower-temperature air located outside of the housing 100 through the second heat exchanging unit 120 and condenses into the liquid. Then, the liquid state refrigerant in the second heat exchanging unit 120 is returned into the first heat exchanging unit 110 through the other one of the pipes 130. In this manner, the heat is transferred from the higher-temperature air located within the housing 100 to the lower-temperature air located outside of the housing 100. Thus, the rise of the temperature of the internal air located within the housing 100 is restrained.

When the liquid state refrigerant starts boiling in the first heat exchanging unit 110, a pressure difference is created between the first heat exchanging unit 110 and the second heat exchanging unit 120 in the boiling cooling system. As the pressure difference is created, a fluid level of the liquid state refrigerant in the higher pressure side, i.e., in the first heat exchanging unit 110 drops while a fluid level of the liquid state refrigerant in the lower pressure side, i.e., in the second heat exchanging unit 120 rises. At this stage, when the fluid level of the liquid state refrigerant in the lower pressure side, i.e., in the second heat exchanging unit 120 rises, the liquid state refrigerant occupies a lower portion of a heat radiating core of the second heat exchanging unit 120. Thus, an effective heat radiating surface area of the second heat exchanging unit 120 decreases, resulting in a decrease in a heat radiating performance. To address this disadvantage, in the previously proposed boiling cooling system, an upper tank 111 of the first heat exchanging unit 110 is positioned below and is spaced apart from a lower tank 121 of the second heat exchanging unit 120 in such a manner that a vertical space corresponding to the pressure difference (head difference) H between the higher pressure side and the lower pressure side is provided between the upper tank 111 of the first heat exchanging unit 111 and the lower tank 121 of the second heat exchanging unit 120, as shown in FIG. 6. Because of the vertical space corresponding to the head difference H, the liquid state refrigerant does not reach the heat radiating core of the second heat exchanging unit 120, so that the required heat radiating performance of the second heat exchanging unit 120 is maintained during the operation of the boiling cooling system.

However, in such a boiling cooling system, in order to further improve the heat radiating performance of the second heat exchanging unit 120 without modifying the vertical space corresponding to the head difference H, a vertical size of the second heat exchanging unit 120 needs to be increased. This causes a disadvantageous increase in an entire vertical size of the boiling cooling system.

SUMMARY OF THE INVENTION

The present invention addresses the above disadvantages. Thus, it is an objective of the present invention to provide a boiling cooling system that has an improved heat radiating performance without substantially increasing a size of the boiling cooling system.

To achieve the objective of the present invention, there is provided a boiling cooling system that exchanges heat between a higher-temperature fluid and a lower-temperature fluid through boiling heat transfer of a refrigerant sealingly contained within the boiling cooling system. The boiling cooling system includes a first heat exchanging unit, a second heat exchanging unit, a vapor transfer pipe and a liquid return pipe.

The first heat exchanging unit includes a boiling core and an upper tank. The boiling core exchanges heat between the higher-temperature fluid and the refrigerant upon exposure to the higher-temperature fluid. The upper tank is arranged above the boiling core and fluidly communicates with the boiling core.

The second heat exchanging unit includes a heat radiating core and a lower tank. The heat radiating core exchanges heat between the lower-temperature fluid and the refrigerant upon exposure to the lower-temperature fluid. The lower tank is arranged below the heat radiating core and fluidly communicates with the heat radiating core.

The vapor transfer pipe communicates the first heat exchanging unit with the second heat exchanging unit to conduct the refrigerant in a vapor state. The refrigerant is transformed into the vapor state within the first heat exchanging unit upon absorbing heat from the higher-temperature fluid. The refrigerant in the vapor state in the first heat exchanging unit flows to the second heat exchanging unit through the vapor transfer pipe.

The liquid return pipe communicates the second heat exchanging unit with the first heat exchanging unit to conduct the refrigerant in a liquid state. The refrigerant is transformed into the liquid state within the second heat exchanging unit upon radiating heat into the lower-temperature fluid. The refrigerant in the liquid state in the second heat exchanging unit flows to the first heat exchanging unit through the liquid return pipe.

The upper tank of the first heat exchanging unit is arranged at generally the same height as that of the lower tank of the second heat exchanging unit. An upstream end of the vapor transfer pipe is connected to the upper tank of the first heat exchanging unit. An upstream end of the liquid return pipe is connected to the lower tank of the second heat exchanging unit. The refrigerant in the liquid state generally fills up to a top of an interior space of the upper tank of the first heat exchanging unit and also generally fills up to a top of an interior space of the lower tank of the second heat exchanging unit while the boiling cooling system is not operated.

BRIEF DESCRIPTION OF THE DRAWINGS

The invention, together with additional objectives, features and advantages thereof, will be best understood from the following description, the appended claims and the accompanying drawings in which:

FIG. 3 is a schematic side view of the boiling cooling system according to the first embodiment;

FIG. 4 is a schematic side view showing a modification of the boiling cooling system;

DETAILED DESCRIPTION OF THE INVENTION

Various embodiments of the present invention will be described with reference to the accompanying drawings.
(First Embodiment)

Figure 1:
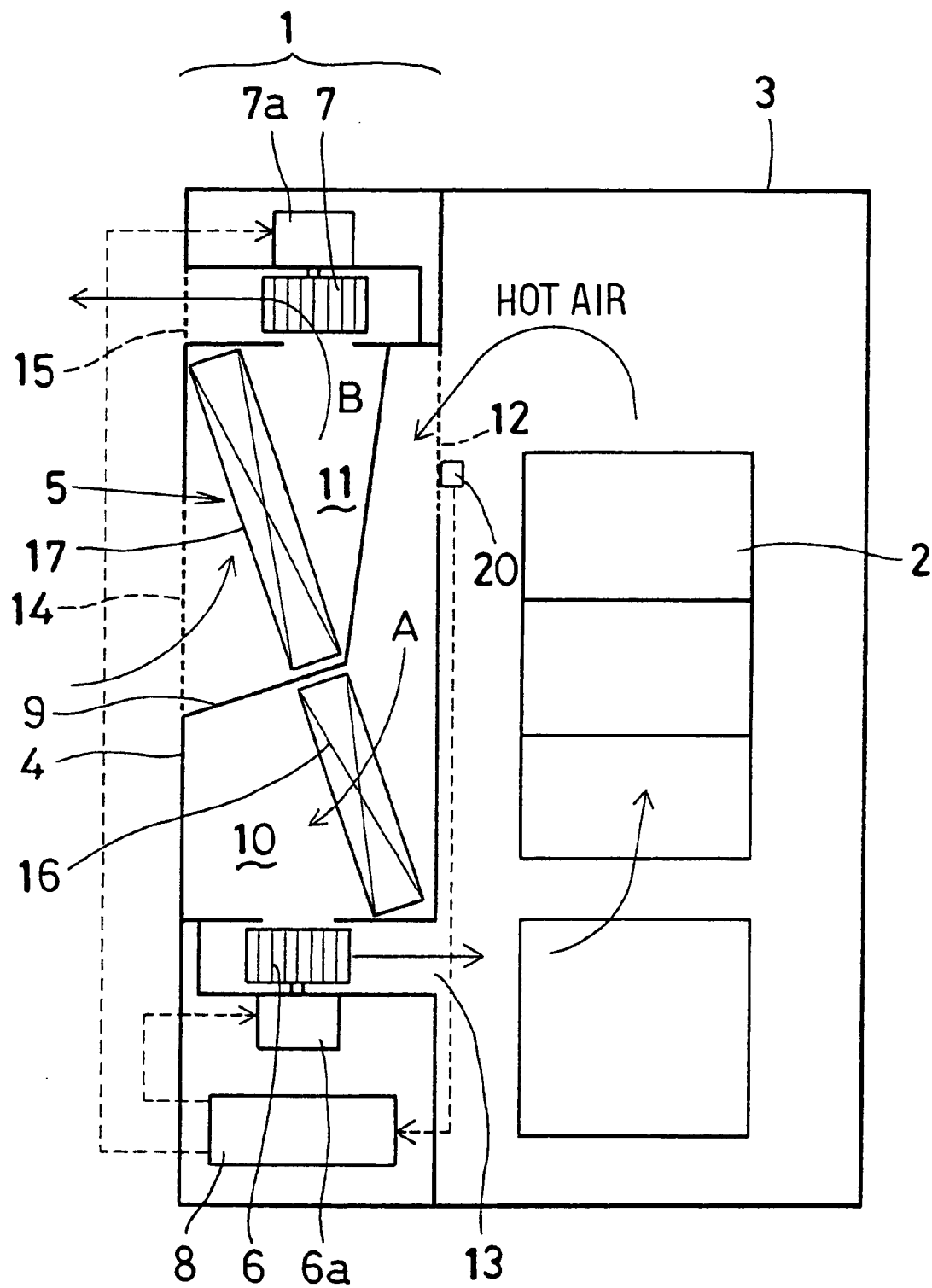
FIG. 1 is a schematic side view of a panel cooler according to a first embodiment of the present invention mounted to a base station of a radio communication system.

With reference to FIG. 1, a panel cooler 1 according to a first embodiment of the present invention can be used, for example, in a base station of a mobile radio communication system (e.g., a cellular phone system, automobile telephone system or the like).

Such a base station normally includes electronic devices (e.g., a transmitter, a receiver and the like) 2 that are sensitive to foreign matter, such as dust, dirt, moisture, rain, snow or the like. Thus, a housing 3 of the base station which receives the electronic devices 2 is substantially airtightly closed while the panel cooler 1 is mounted and is held within the housing 3.

As shown in FIG. 1, the panel cooler 1 is mounted within the housing 3 in such a manner that the panel cooler 1 airtightly closes one side of the housing 3. The panel cooler 1 includes a casing 4, a boiling cooling system 5, an internal-air fan 6, an external-air fan 7 and a controller 8.

The casing 4 has a higher-temperature side heat transferring space 10 and a lower-temperature side heat transferring space 11 that are airtightly separated from each other by a partition wall 9. Furthermore, the casing 4 has an internal-air inlet 12 and an internal-air outlet 13, both of which cooperate together to allow fluid communication between the higher-temperature side heat transferring space 10 and the interior of the housing 3. The casing 4 also has an external-air inlet 14 and an external-air outlet 15, both of which cooperate together to allow fluid communication between the lower-temperature side heat transferring space 11 and the outside of the housing 3.

Figure 2:
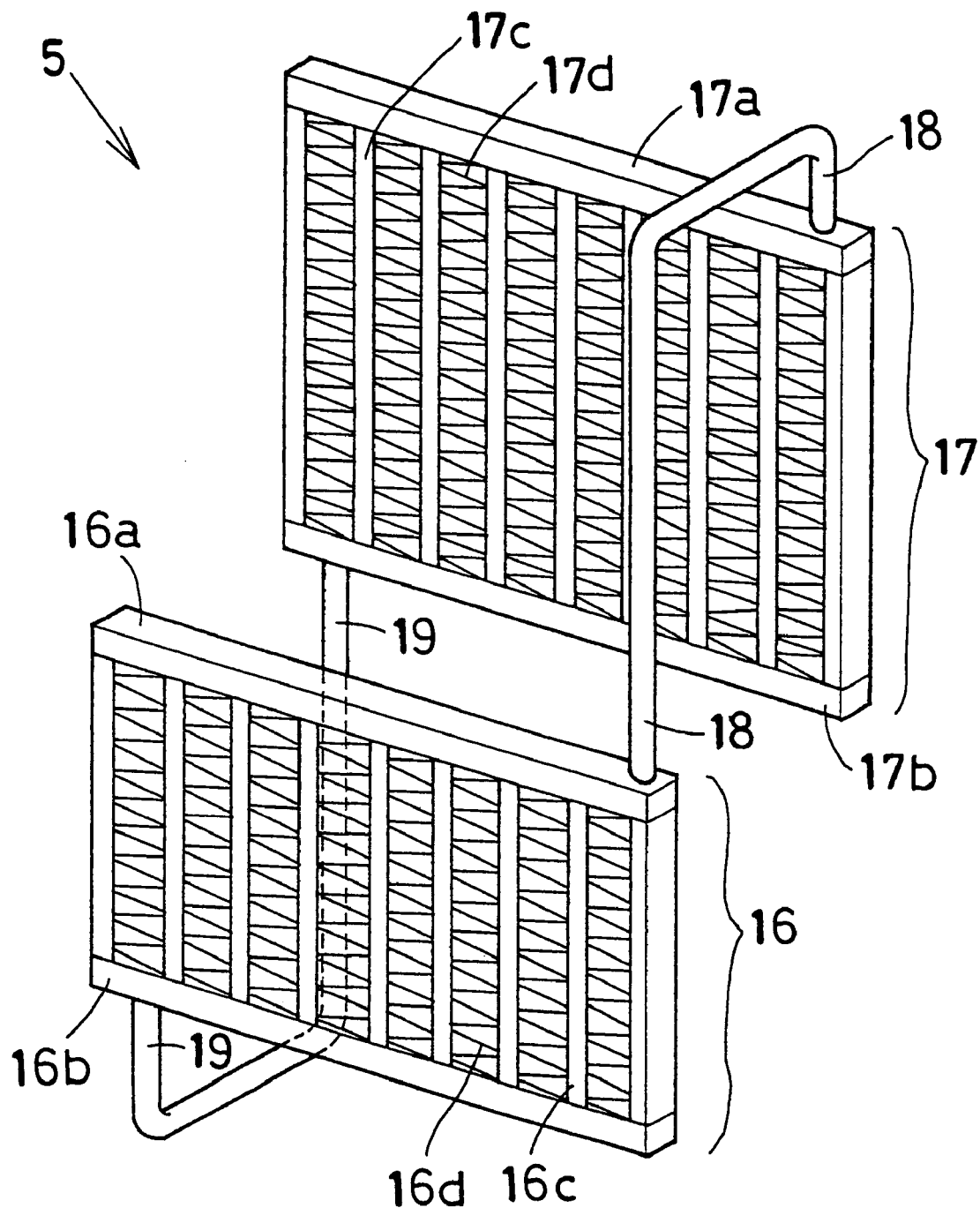
FIG. 2 is a schematic perspective view of a boiling cooling system according to the first embodiment of the present invention.

With reference to FIG. 2, the boiling cooling system 5 includes a heat absorbing unit (first heat exchanging unit) 16, a heat radiating unit (second heat exchanging unit) 17 and two connecting pipes 18, 19. The heat absorbing unit 16 is arranged in the higher-temperature side heat transferring space 10. The heat radiating unit 17 is arranged in the lower-temperature side heat transferring space 11. The connecting pipes 18, 19 sealingly penetrate through the partition wall 9 and communicate the heat absorbing unit 16 to the heat radiating unit 17. A predetermined amount of refrigerant is sealingly received in the boiling cooling system 5.

The heat absorbing unit 16 includes a pair of tanks (upper and lower tanks) 16a, 16b, a plurality of vertically extending heat absorbing pipes 16c connected between the tanks 16a, 16b, and a plurality of heat absorbing fins 16d connected to surfaces of the corresponding heat absorbing pipes 16c. The heat absorbing pipes 16c and the heat absorbing fins 16d form a boiling core of the present invention.

The heat radiating unit 17 includes a pair of tanks (upper and lower tanks) 17a, 17b, a plurality of vertically extending heat radiating pipes 17c connected between the tanks 17a, 17b, and a plurality of heat radiating fins 17d connected to surfaces of the corresponding heat radiating pipes 17c. The heat radiating pipes 17c and the heat radiating fins 17d form a heat radiating core of the present invention.

As shown in FIG. 3, the heat absorbing unit 16 and the heat radiating unit 17 are arranged in such a manner that the upper tank 16a of the heat absorbing unit 16 is arranged at generally the same level or height as that of the lower tank 17b of the heat radiating unit 17. Furthermore, the liquid state refrigerant is charged into the boiling cooling system 5 in such a manner that the liquid state refrigerant generally fills up to a top of an interior space of the upper tank 16a of the heat absorbing unit 16 and also generally fills up to a top of an interior space of the lower tank 17b of the heat radiating unit 17 while the boiling cooling system 5 is not operated.

Thus, the liquid state refrigerant fills the interior of the lower tank 17b of the heat radiating unit 17 before operation of the boiling cooling system 5. At this stage, when the liquid state refrigerant starts boiling in the heat absorbing unit 16, a level of the liquid state refrigerant within the heat radiating unit 17 rises and reaches an interior of each heat radiating pipe 17c due to a pressure difference between the heat absorbing unit 16 and the heat radiating unit 17, so that a lower part of each heat radiating pipe 17c is filled with the liquid state refrigerant. If a size (heat radiating surface area) of the heat radiating unit 17 is simply determined based only on a size (heat absorbing surface area) of the heat absorbing unit 16, the performance of the heat radiating unit 17 becomes insufficient due to reduction in the heat radiating surface area of the heat radiating unit 17 caused by the liquid state refrigerant present in each heat radiating pipe 17c. To address this disadvantage, in accordance with the present embodiment, a vertical length (height) of the heat radiating unit 17 is increased from the one whose size is determined based only on the size of the heat absorbing unit 16. That is, the vertical length of the heat radiating unit 17 is increased by an amount that corresponds to the loss of the heat radiating surface area caused by the raised level of the liquid state refrigerant in each heat radiating pipe 17*c*. Thus, the heat radiating unit 17 can retain a minimum required heat radiating surface area that is determined based on the size of the heat absorbing unit 16 when the level of the liquid state refrigerant within the heat radiating unit 17 rises due to the boiling of the liquid state refrigerant in the heat absorbing unit 16.

With reference to FIG. 2, one of the two connecting pipes 18 and 19 is a vapor transfer pipe 18 that conducts the vapor state refrigerant that has been transformed from the liquid state refrigerant upon boiling and vaporization of the same in the heat absorbing unit 16 due to the heat absorbed from higher-temperature fluid (e.g., hot air) introduced into the higher-temperature side heat transferring space 10. The other of the two connecting pipes 18 and 19 is a liquid return pipe 19 that returns the liquid state refrigerant that has been transformed from the vapor state refrigerant upon condensation of the same in the heat radiating unit 17 due to the radiation of the heat into external air or lower-temperature fluid introduced into the lower-temperature side heat transferring space 11. Both the pipes 18 and 19 sealingly extend through the partition wall 9.

An upstream end of the vapor transfer pipe 18 is connected to the upper tank 16*a* of the heat absorbing unit 16, and a downstream end of the vapor transfer pipe 18 is connected to the upper tank 17*a* of the heat radiating unit 17.

An upstream end of the liquid return pipe 19 is connected to the lower tank 17*b* of the heat radiating unit 17, and a downstream end of the liquid return pipe 19 is connected to the lower tank 16*b* of the heat absorbing unit 16.

With reference to FIG. 1, the internal air fan 6 draws the hot internal air (higher-temperature fluid) located in the interior of the housing 3 through the internal air inlet 12 and also through the heat absorbing unit 16 of the boiling cooling system 5 all the way through the higher-temperature side heat transferring space 10 and expels it into the interior of the housing 3 through the internal air outlet 13.

The external air fan 7 draws the external air (lower-temperature fluid) located outside of the housing 3 through the external air inlet 14 and also through the heat radiating unit 17 of the boiling cooling system 5 all the way through the lower-temperature side heat transferring space 11 and expels it into the atmosphere through the external air outlet 15.

The controller 8 monitors a temperature of the internal air located within the interior of the housing 3 with a temperature sensor 20, such as a thermistor. The controller 8 controls a motor 6*a* of the internal air fan 6 and a motor 7*a* of the external air fan 7 based on the monitored temperature. As shown in FIG. 1, the temperature sensor 20 is arranged at the internal air inlet 12 to measure the temperature of the air drawn into the higher-temperature side heat transferring space 10 through the internal air inlet 12.

Operation of the panel cooler 1 will now be described.

When the internal air fan 6 is actuated, an air flow is created through the higher-temperature side heat transferring space 10 within the casing 4, as indicated with the arrow A in FIG. 1. Thus, the internal air within the housing 3 is circulated between the higher-temperature side heat transferring space 10 and the interior of the housing 3.

When the external air fan 7 is actuated, another air flow is created throughout the lower-temperature side heat transferring space 11 within the casing 4, as indicated with the arrow B in FIG. 1. Thus, the external air outside of the housing 3 is circulated through the lower-temperature side heat transferring space 11.

In the heat absorbing unit 16 arranged in the higher-temperature side heat transferring space 10, the liquid state refrigerant within each heat absorbing pipe 16*c* boils and evaporates upon absorbing the heat from the hot air passing through the higher-temperature side heat transferring space 10. Then, the evaporated vapor state refrigerant flows into the upper tank 16*a* from each heat absorbing pipe 16*c* and then into the upper tank 17*a* of the heat radiating unit 17 through the vapor transfer pipe 18.

In the heat radiating unit 17 arranged in the lower-temperature side heat transferring space 11, when the vapor state refrigerant conducted into the upper tank 17*a* flows to the lower tank 17*b* through each heat radiating pipe 17*c*, the vapor state refrigerant radiates heat into the external air passing through the lower-temperature side heat transferring space 11 and is condensed into droplets. Due to its own weight, each refrigerant droplet flows downward along an internal wall of each heat radiating pipe 17*c* and is dropped into the lower tank 17*b*. Then, the liquid state refrigerant flows into the lower tank 16*b* of the heat absorbing unit 16 through the liquid return pipe 19.

By repeating the above described cycle (boiling and condensing of the refrigerant) in the boiling cooling system 5, the heat radiated from the electronic devices 2 is released into the external air, so that temperature increase of the internal air within the housing 3 is effectively restrained.

The above described embodiment provides the following advantages.

In the boiling cooling system 5 according to the present embodiment, when the liquid state refrigerant starts boiling in the heat absorbing unit 16, the fluid level of the liquid state refrigerant in the heat radiating unit 17 rises, so that about lower one half to one third of each heat radiating pipe 17*c* is filled with the liquid state refrigerant, as shown in FIG. 3. At this state, the lower one half to one third of the heat radiating core of the heat radiating unit 17 acts as a supercooling section in which the liquid state refrigerant is further cooled to a lower temperature by heat exchange with the external air. The supercooled liquid state refrigerant is then returned to the heat absorbing unit 16, so that the temperature of the refrigerant in the heat absorbing unit 16 decreases. As a result, the amount of heat that the liquid refrigerant can absorb from the higher-temperature air (hot air) is increased in the heat absorbing unit 16. Thus, the heat radiating performance of the boiling cooling system 5 is improved.

Figure 6:
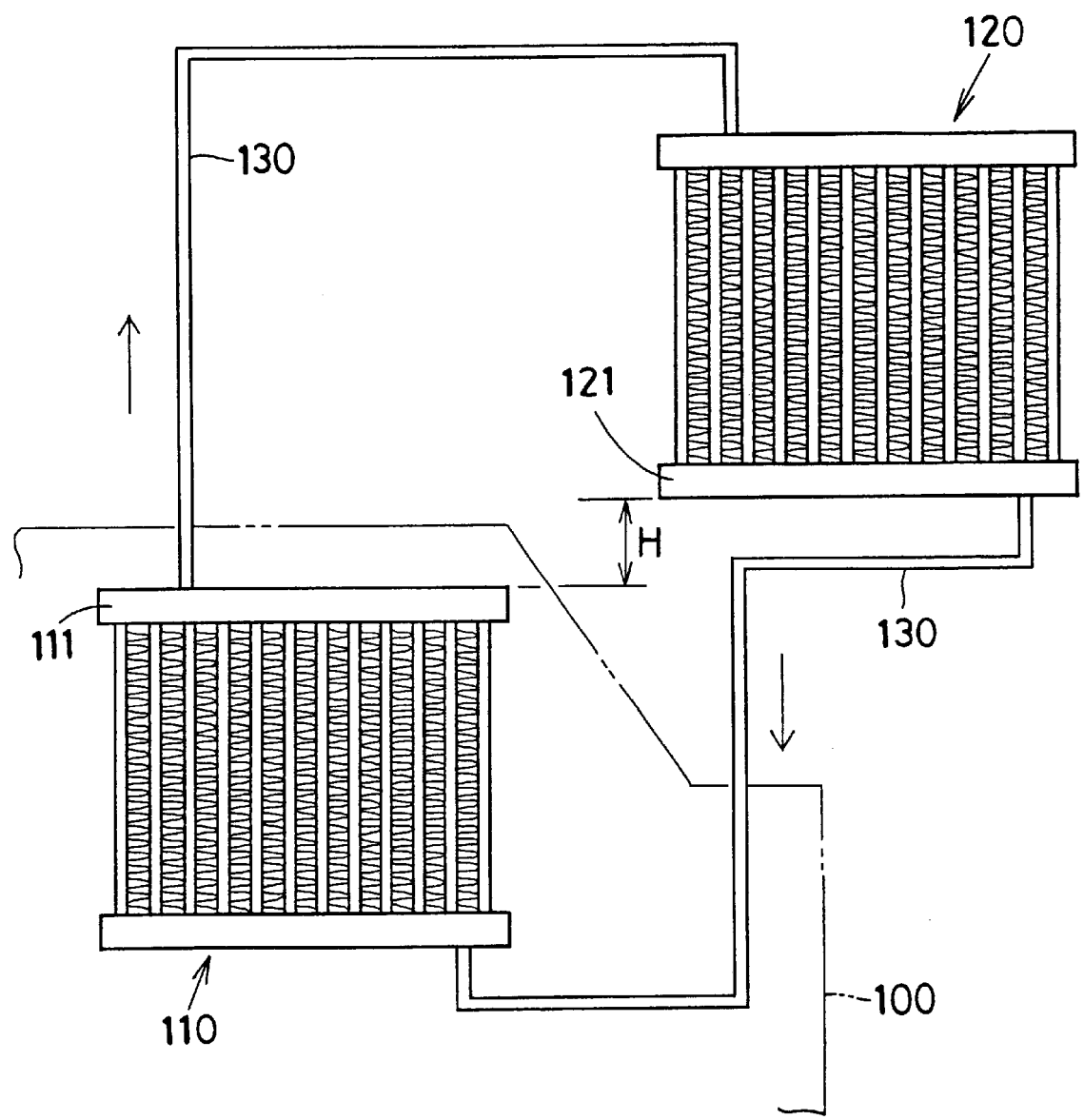
FIG. 6 is a front schematic view of a previously proposed boiling cooling system.

The heat radiating unit 17 uses the lower portion of the heat radiating unit 17, which corresponds to the head difference H (FIG. 6) of the previously proposed boiling cooling system, as the supercooling section. Thus, the entire height of the boiling cooling system 5 does not substantially increase. As a result, without substantially increasing the size of the boiling cooling system 5, the heat radiating performance of the boiling cooling system 5 is improved according to the present embodiment.

In the above-described embodiment, the upper tank 16*a* of the heat absorbing unit 16 is arranged at generally the same height as that of the lower tank 17*b* of the heat radiating unit 17. However, as shown in FIG. 4, the lower tank 17*b* of the heat radiating unit 17 can be placed below the upper tank 16*a* of the heat absorbing unit 16. Even with this arrangement, the advantages similar to those discussed above can be achieved.

(Second Embodiment)

A boiling cooling system 5 according to a second embodiment of the present invention will be described with reference to FIG. 5.

The boiling cooling system 5 according to the first embodiment is constructed as one integrated assembly that forms the panel cooler 1 in cooperation with the internal air fan 6, the external air fan 7 and the others. However, according to the second embodiment, the boiling cooling system 5 is separated into an internal arrangement 5A and an external arrangement 5B. The internal arrangement 5A includes the heat absorbing unit 16 and the internal air fan 6 and is arranged inside of the housing 3. The external arrangement 5B includes the heat radiating unit 17 and the external air fan 7 and is arranged outside of the housing 3. The vapor transfer pipe 18 and the liquid return pipe 19, both of which sealingly penetrate through a side wall of the housing 3, connect the heat absorbing unit 16 to the heat radiating unit 17.

Figure 5:
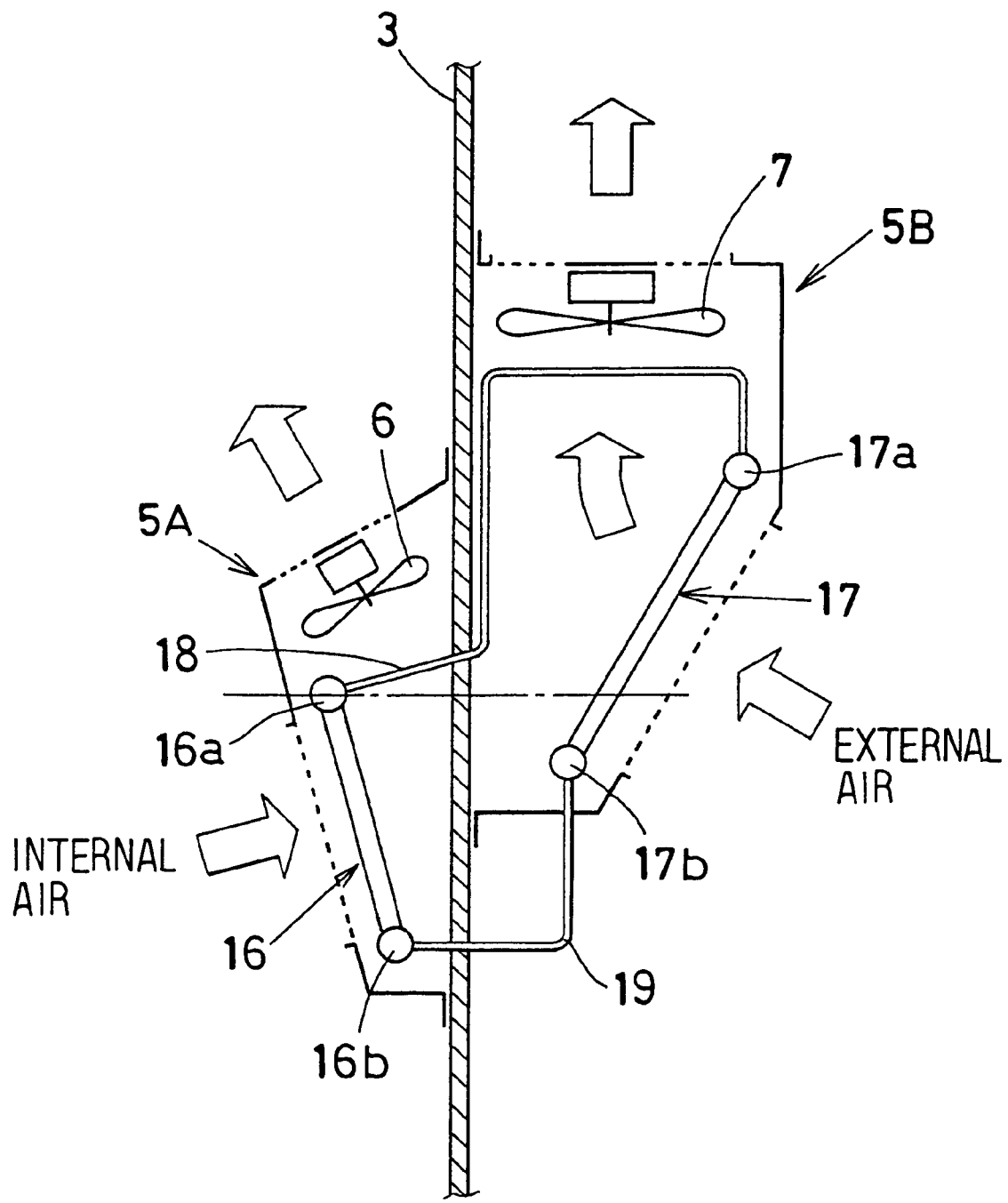
FIG. 5 is a schematic side view showing construction of a boiling cooling system according to a second embodiment of the present invention.

Similar to the first embodiment, the heat absorbing unit 16 and the heat radiating unit 17 are arranged in such a manner that the upper tank 16a of the heat absorbing unit 16 is arranged at generally the same height as that of the lower tank 17b of the hear radiating unit 17, or alternatively the lower tank 17b of the heat radiating unit 17 is arranged below the upper tank 16a of the heat absorbing unit 16, as shown in FIG. 5. In this way, about lower one half to one third of the heat radiating core of the heat radiating unit 17 acts as the supercooling section in which the liquid refrigerant is further cooled to a lower temperature by heat exchange with the external air. The supercooled liquid state refrigerant is returned to the heat absorbing unit 16, so that the temperature of the refrigerant in the heat absorbing unit 16 decreases. As a result, the amount of heat that the liquid refrigerant can absorb from the hot air is increased in the heat absorbing unit 16. Thus, the heat radiating performance of the boiling cooling system 5 is improved.

Additional advantages and modifications will readily occur to those skilled in the art. The invention in its broader terms is therefore, not limited to the specific details, representative apparatus, and illustrative examples shown and described. For instance, in the above described embodiments, the liquid state refrigerant is charged into the boiling cooling system 5 in such a manner that the liquid state refrigerant generally fills up to the top of the interior space of the upper tank 16a of the heat absorbing unit 16 and also generally fills up to the top of the interior space of the lower tank 17b of the heat radiating unit 17 while the boiling cooling system 5 is not operated. This arrangement can be modified as follows. That is, the liquid state refrigerant may be charged into the boiling cooling system 5 in such a manner that the liquid state refrigerant generally fills up to at least a portion of the interior space of the upper tank 16a of the heat absorbing unit 16 and also generally fills up to at least a portion of the interior space of the lower tank 17b of the heat radiating unit while the boiling cooling system 5 is not operated.

What is claimed is:

1. A boiling cooling system that exchanges heat between a higher-temperature fluid in a high-temperature zone and a lower-temperature fluid in a low-temperature zone through boiling heat transfer of a refrigerant sealed within said boiling cooling system, said boiling cooling system comprising:

a generally vertically extending first heat exchanging unit entirely located in said high-temperature zone, said first heat exchanging unit including a boiling core, an upper tank and a lower tank, said boiling core including a plurality of generally vertically extending heat absorbing pipes and exchanging heat between said higher-temperature fluid and said refrigerant upon exposure to said higher-temperature fluid, said upper tank of said first heat exchanging unit being arranged above said boiling core and fluidly communicating with upper ends of said heat absorbing pipes of said boiling core, said lower tank of said first heat exchanging unit being arranged below said boiling core and fluidly communicating with lower ends of said heat absorbing pipes of said boiling core;

a generally vertically extending second heat exchanging unit entirely located in said low-temperature zone, said second heat exchanging unit including a heat radiating core, an upper tank and a lower tank, said heat radiating core including a plurality of generally vertically extending heat radiating pipes and exchanging heat between said lower-temperature fluid and said refrigerant upon exposure to said lower-temperature fluid, said upper tank of said second heat exchanging unit being arranged above said heat radiating core and fluidly communicating with upper ends of said heat radiating pipes of said heat radiating core, said lower tank of said second heat exchanging unit being arranged below said heat radiating core and fluidly communicating with lower ends of said heat radiating pipes of said heat radiating core;

a vapor transfer pipe that communicates said first heat exchanging unit with said second heat exchanging unit to conduct said refrigerant in a vapor state, said refrigerant being transformed into said vapor state within said first heat exchanging unit upon absorbing heat from said higher-temperature fluid, said refrigerant in said vapor state in said first heat exchanging unit flowing to said second heat exchanging unit through said vapor transfer pipe; and a liquid return pipe that communicates said second heat exchanging unit with said first heat exchanging unit to conduct said refrigerant in a liquid state, said refrigerant being transformed into said liquid state within said second heat exchanging unit upon transferring heat to said lower-temperature fluid, said refrigerant in said liquid state in said second heat exchanging unit flowing to said first heat exchanging unit through said liquid return pipe; wherein:

said upper tank of said first heat exchanging unit is arranged at generally the same height as that of said lower tank of said second heat exchanging unit, an upstream end of said vapor transfer pipe being connected to said upper tank of said first heat exchanging unit, a downstream end of said vapor transfer pipe being connected to said upper tank of said second heat exchanging unit, an upstream end of said liquid return pipe being connected to said lower tank of said second heat exchanging unit, a downstream end of said liquid return pipe being connected to said lower tank of said first heat exchanging unit, said refrigerant in said upper tank of said first heat exchanging unit being conducted to said lower tank of said second heat exchange unit only through said vapor transfer pipe and said heat radiating pipes; and said refrigerant in said liquid state generally fills the interior space of said upper tank of said first heat exchanging unit and also generally fills the interior space of said lower tank of said second heat exchanging unit when said boiling cooling system is not being operated.

2. A boiling cooling system according to claim 1, wherein said heat radiating core of said second heat exchanging unit includes:

at least a minimum required heat radiating surface area that is determined based on a heat absorbing surface area of said boiling core of said first heat exchanging unit; and a supercooling section in which said refrigerant in said liquid state is contained during operation of said boiling cooling system to allow said refrigerant in said liquid state contained in said supercooling section to transfer heat to said lower-temperature fluid.

3. A boiling cooling system according to claim 1, wherein the size of said upper tank of said first heat exchanging unit is generally the same as that of said lower tank of said second heat exchanging unit.

4. A boiling cooling system that exchanges heat between a higher-temperature fluid in a high-temperature zone and a lower-temperature fluid in a low-temperature zone through boiling heat transfer of a refrigerant sealed within said boiling cooling system, said boiling cooling system comprising:

a generally vertically extending first heat exchanging unit entirely located in said high-temperature zone, said first heat exchanging unit including a boiling core, an upper tank and a lower tank, said boiling core including a plurality of generally vertically extending heat absorbing pipes and exchanging heat between said higher-temperature fluid and said refrigerant upon exposure to said higher-temperature fluid, said upper tank of said first heat exchanging unit being arranged above said boiling core and fluidly communicating with upper ends of said heat absorbing pipes of said boiling core, said lower tank of said first heat exchanging unit being arranged below said boiling core and fluidly communicating with lower ends of said heat absorbing pipes of said boiling core;

a generally vertically extending second heat exchanging unit entirely located in said low-temperature zone, said second heat exchanging unit including a heat radiating core, an upper tank and a lower tank, said heat radiating core including a plurality of generally vertically extending heat radiating pipes and exchanging heat between said lower-temperature fluid and said refrigerant upon exposure to said lower-temperature fluid, said upper tank of said second heat exchanging unit being arranged above said heat radiating core and fluidly communicating with upper ends of said heat radiating pipes of said heat radiating core, said lower tank of said second heat exchanging unit being arranged below said heat radiating core and fluidly communicating with lower ends of said heat radiating pipes of said heat radiating core;

a vapor transfer pipe that communicates said first heat exchanging unit with said second heat exchanging unit to conduct said refrigerant in a vapor state, said refrigerant being transformed into said vapor state within said first heat exchanging unit upon absorbing heat from said higher-temperature fluid, said refrigerant in said vapor state in said first heat exchanging unit flowing to said second heat exchanging unit through said vapor transfer pipe; and a liquid return pipe that communicates said second heat exchanging unit with said first heat exchanging unit to conduct said refrigerant in a liquid state, said refrigerant being transformed into said liquid state within said second heat exchanging unit upon transferring heat to said lower-temperature fluid, said refrigerant in said liquid state in said second heat exchanging unit flowing to said first heat exchanging unit through said liquid return pipe; wherein:

said upper tank of said first heat exchanging unit is arranged above said lower tank of said second heat exchanging unit, an upstream end of said vapor transfer pipe being connected to said upper tank of said first heat exchanging unit, a downstream end of said vapor transfer pipe being connected to said upper tank of said second heat exchanging unit, an upstream end of said liquid return pipe being connected to said lower tank of said second heat exchanging unit, a downstream end of said liquid return pipe being connected to said lower tank of said first heat exchanging unit, said refrigerant in said upper tank of said first heat exchanging unit being conducted to said lower tank of said second heat exchange unit only through said vapor transfer pipe and said heat radiating pipes; and said refrigerant in said liquid state generally fills the interior space of said upper tank of said first heat exchanging unit when said boiling cooling system is not being operated.

5. A boiling cooling system according to claim 4, wherein said heat radiating core of said second heat exchanging unit includes:

at least a minimum required heat radiating surface area that is determined based on a heat absorbing surface area of said boiling core of said first heat exchanging unit; and a supercooling section in which said refrigerant in said liquid state is contained during operation of said boiling cooling system to allow said refrigerant in said liquid state contained in said supercooling section to transfer heat to said lower-temperature fluid.

\* \* \* \* \*